United States Patent
Jung et al.

(10) Patent No.: US 12,433,072 B2
(45) Date of Patent: Sep. 30, 2025

(54) DISPLAY DEVICE

(71) Applicant: SAMSUNG SDI CO., LTD., Yongin-si (KR)

(72) Inventors: Juho Jung, Suwon-si (KR); Jongho Park, Suwon-si (KR); Gyuseok Han, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 457 days.

(21) Appl. No.: 18/092,594

(22) Filed: Jan. 3, 2023

(65) Prior Publication Data

US 2023/0402574 A1    Dec. 14, 2023

(30) Foreign Application Priority Data

Jun. 9, 2022    (KR) .................. 10-2022-0070315

(51) Int. Cl.
| | |
|---|---|
| *H10H 20/851* | (2025.01) |
| *G02B 5/20* | (2006.01) |
| *H01L 25/075* | (2006.01) |
| *H01L 25/16* | (2023.01) |
| *H10D 86/40* | (2025.01) |
| *H10H 20/855* | (2025.01) |
| *H10H 29/14* | (2025.01) |

(Continued)

(52) U.S. Cl.
CPC ......... *H10H 20/8513* (2025.01); *G02B 5/206* (2013.01); *H10K 59/38* (2023.02); *G02B 2207/101* (2013.01); *G02B 2207/113* (2013.01); *H10K 2102/331* (2023.02)

(58) Field of Classification Search
CPC .............. H10K 59/38; H10K 2102/331; H01L 25/0753; H01L 25/167; H10H 20/8512; H10H 20/8514; H10H 20/855; G02B 5/206

See application file for complete search history.

(56) References Cited

U.S. PATENT DOCUMENTS

| | | | |
|---|---|---|---|
| 2012/0113672 A1* | 5/2012 | Dubrow | G02B 6/0055 977/774 |
| 2012/0235117 A1 | 9/2012 | Fukui et al. | |

(Continued)

FOREIGN PATENT DOCUMENTS

| | | |
|---|---|---|
| CN | 110607094 A | 12/2019 |
| JP | 2000-129151 A | 5/2000 |

(Continued)

OTHER PUBLICATIONS

Japanese Office action dated Jun. 11, 2024.
(Continued)

*Primary Examiner* — Mohsen Ahmadi
(74) *Attorney, Agent, or Firm* — Lee IP Law, P.C.

(57) ABSTRACT

A display device includes a first substrate; a blue light source on the first substrate; a wavelength converter on the blue light source; and a color filter layer on the wavelength converter, wherein the blue light source includes a quantum dot nanorod light emitting diode configured to emit blue light in a wavelength range of about 400 nm to about 500 nm, and the wavelength converter includes a light emitting material or a fluorescent material, the wavelength converter being configured to convert the blue light emitted from the blue light source into white light.

16 Claims, 5 Drawing Sheets

(51) Int. Cl.
*H10K 59/38* (2023.01)
*H10K 102/00* (2023.01)

(56) References Cited

U.S. PATENT DOCUMENTS

| | | |
|---|---|---|
| 2013/0027623 A1 | 1/2013 | Negishi et al. |
| 2015/0349215 A1 | 12/2015 | Gootz et al. |
| 2016/0013364 A1 | 1/2016 | Cha et al. |
| 2017/0299792 A1* | 10/2017 | Oh .................... F21V 9/45 |
| 2017/0322451 A1* | 11/2017 | Kang .................. C09K 11/883 |
| 2018/0188609 A1* | 7/2018 | Jun ..................... H10K 50/00 |
| 2018/0292713 A1* | 10/2018 | Drolet ............... G02F 1/133621 |
| 2020/0040255 A1 | 2/2020 | Park et al. |
| 2021/0083152 A1 | 3/2021 | Biebersdorf et al. |
| 2021/0095193 A1 | 4/2021 | Hyung |
| 2021/0129481 A1* | 5/2021 | Dubrow ............ G02F 1/133611 |
| 2021/0159278 A1 | 5/2021 | Lee et al. |
| 2021/0167123 A1 | 6/2021 | Tsai et al. |
| 2022/0045144 A1* | 2/2022 | Lee .................... H10K 71/621 |
| 2022/0403179 A1* | 12/2022 | Hong .................. C08F 220/32 |
| 2023/0111574 A1* | 4/2023 | Lee .................... G06F 3/0446 |
| | | 257/40 |
| 2023/0126210 A1* | 4/2023 | Lee .................... H10K 59/8792 |
| | | 257/91 |
| 2024/0120435 A1* | 4/2024 | Raring ................. H10H 20/01 |
| 2024/0138232 A1* | 4/2024 | Shim ................ H10K 59/1315 |

FOREIGN PATENT DOCUMENTS

| | | |
|---|---|---|
| JP | 2011-192722 A | 9/2011 |
| JP | 2016-510502 A | 4/2016 |
| JP | 2022-082964 A | 6/2022 |
| KR | 10-2011-0102061 A | 9/2011 |
| KR | 10-1186683 B1 | 9/2012 |
| KR | 10-2016-0007997 A | 1/2016 |
| KR | 10-2017-0047641 A | 5/2017 |
| KR | 10-2146549 B1 | 8/2020 |
| KR | 10-2175400 B1 | 11/2020 |
| KR | 10-2021-0065245 A | 6/2021 |
| TW | 201212284 A | 3/2012 |
| WO | WO 2011-067872 A1 | 6/2011 |

OTHER PUBLICATIONS

Korean Office action dated Oct. 30, 2024.
Japanese Notice of Allowance dated Jan. 7, 2025.
Japanese Office action dated Dec. 19, 2023.
Taiwanese Office action dated Jan. 22, 2024.

* cited by examiner

DISPLAY DEVICE

CROSS-REFERENCE TO RELATED APPLICATION

This application claims priority to and the benefit of Korean Patent Application No. 10-2022-0070315 filed in the Korean Intellectual Property Office on Jun. 9, 2022, the entire contents of which are incorporated herein by reference.

BACKGROUND

1. Field

Embodiments relate to a display device.

2. Description of the Related Art

Quantum dot-containing display materials that have recently been commercialized or are under development may use light emission of green quantum dots and red quantum dots through a blue light source or a white light source.

The quantum dot materials may help improve color reproducibility and luminance of quantum dot-containing display devices, and development of panels using the quantum dot light emission is being made by using various types of light sources. In addition, the quantum dot material may also help improve a viewing angle depending on application positions in configuration of the devices.

SUMMARY

The embodiments may be realized by providing a display device including a first substrate; a blue light source on the first substrate; a wavelength converter on the blue light source; and a color filter layer on the wavelength converter, wherein the blue light source includes a quantum dot nanorod light emitting diode configured to emit a blue light in a wavelength range of about 400 nm to about 500 nm, and the wavelength converter includes a light emitting material or a fluorescent material, the wavelength converter being configured to convert the blue light emitted from the blue light source into white light.

The quantum dot nanorod light emitting diode may have a core-double shell structure including a nanorod-shaped core; a first shell surrounding the core; and a second shell surrounding the first shell.

The core may be a first conductivity type semiconductor layer; the first shell may be an active layer; and the second shell may be a second conductivity type semiconductor layer.

The core may include an n-type quantum dot, and the n-type quantum dot includes n-GaN, n-GaP, n-GaAs, or a combination thereof.

The second shell may include a p-type quantum dot, and the p-type quantum dot may include p-GaN, p-GaSi, p-GaGe, or a combination thereof.

The quantum dot nanorod light emitting diode may have a long axis length of about 50 nm to about 100 nm.

The quantum dot nanorod light emitting diode may have an aspect ratio of about 1:2 to about 2:1.

The blue light source may have a thickness of about 11 μm to about 11 μm.

The wavelength converter may include a light emitting material including green quantum dots, red quantum dots, or a combination thereof; or a fluorescent material including YAG:$Ce^{3+}$, KSF, or a combination thereof.

The wavelength converter may have a thickness of about 11 μm to about 11 μm.

The color filter layer may include a first color filter configured to emit a first light, a second color filter configured to emit a second light, and a third color filter configured to emit a third light, and the first light, the second light, and the third light may be different from one another.

The first light may be red light, the second light may be green light, and the third light may be blue light.

The color filter layer may have a thickness of about 1 μm to about 11 μm.

The first substrate may include glass.

The first substrate may have a thickness of about 1 μm to about 11 μm.

The display device may further include a second substrate on the color filter layer.

The second substrate may include glass.

The second substrate may have a thickness of about 1 μm to about 10 μm.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
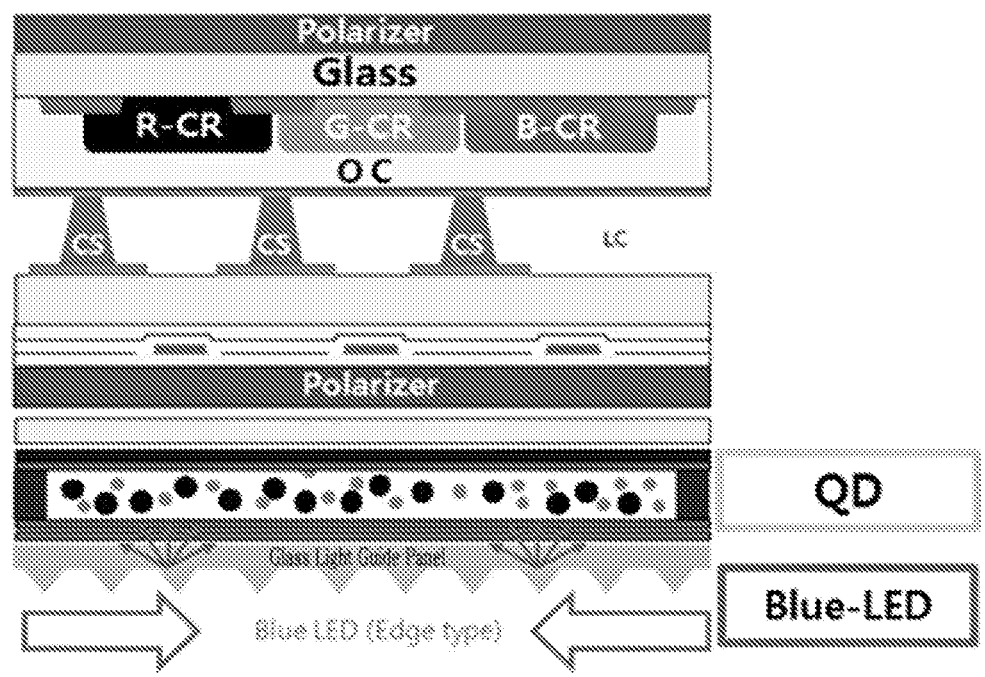
FIG. 1 is a view schematically showing a structure of a QLED.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. As used herein, the term "or" is not an exclusive term, e.g., "A or B" would include A, B, or A and B.

As used herein, when specific definition is not otherwise provided, the term "combination" may refer to mixing or copolymerization.

An embodiment may provide a display device including a first substrate; a blue light source unit or blue light source on the first substrate; a wavelength converter on the blue light source; and a color filter layer on the wavelength converter. In an implementation, the blue light source may include a quantum dot nanorod light emitting diode configured to emit blue light in a wavelength range of about 400 nm to about 500 nm. In an implementation, the wavelength converter may include a light emitting material or a fluorescent material, and may be configured to convert the blue light emitted from the blue light source into white light.

Figure 2:
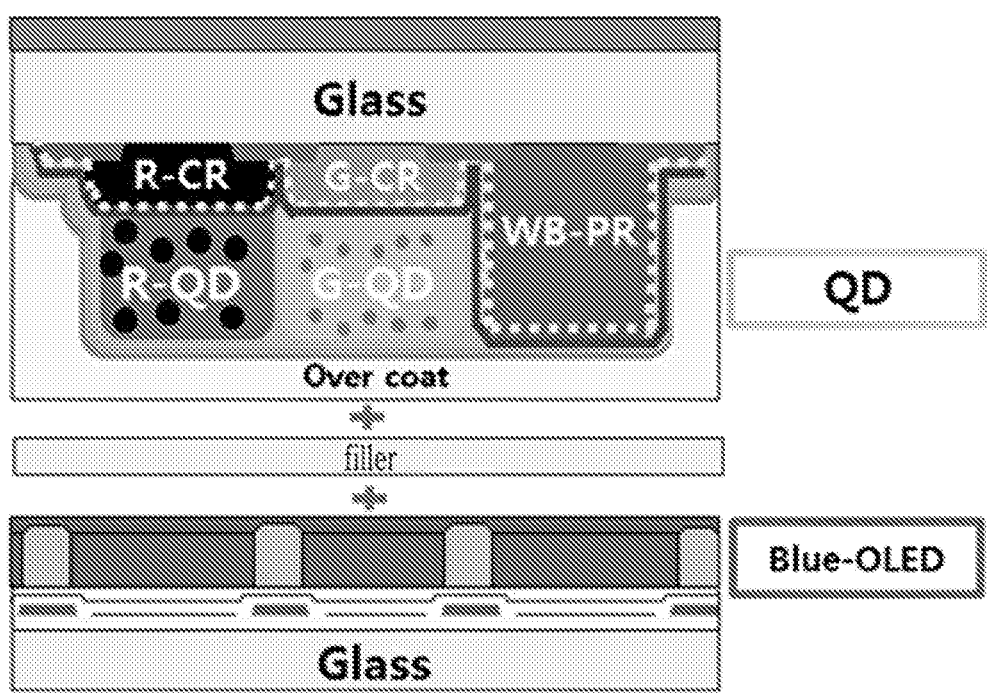
FIG. 2 is a view schematically illustrating a structure of a QD-OLED.

A light emitting diode (LED) type display device using a quantum dot (QD) may have a structure shown in FIGS. 1 and 2. FIG. 1 shows a structure known as "QLED," which corresponds to a structure that a quantum dot film is attached to a backlight unit (BLU) of a LCD panel, wherein a blue light emitting diode (blue LED) is used as a back light unit (BLU), e.g., a light source. In addition, FIG. 2 is a structure known as "QD-OLED," which uses a colored organic light emitting diode (OLED) (blue OLED) as a light source, red (R) and green (G) out of three primary light of red (R), green (G), and blue (B) are expressed through each quantum dot, and blue (B) is expressed through OLED.

FIGS. 1 and 2 are a light-receiving structure in which true black is difficult to express due to an insufficient contrast ratio.

Figure 3:
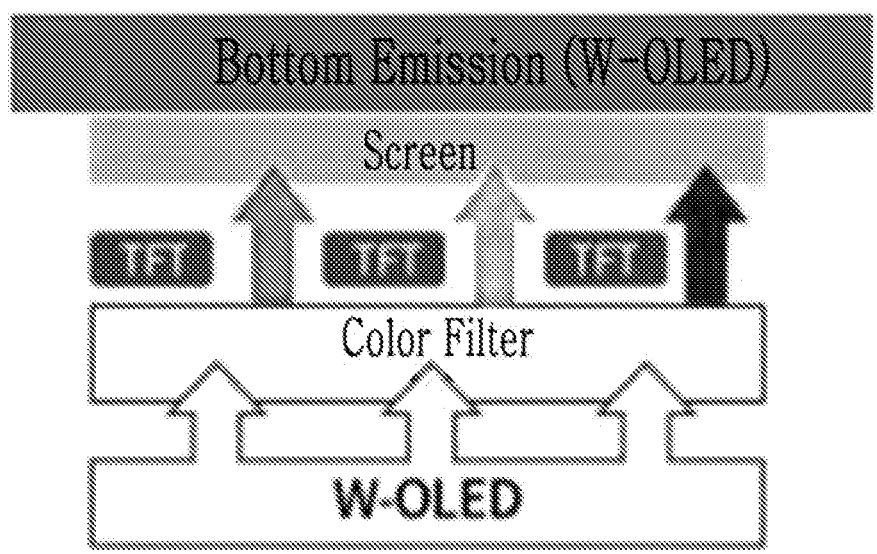
FIG. 3 is a view schematically illustrating a structure of a W-OLED.
Figure 4:
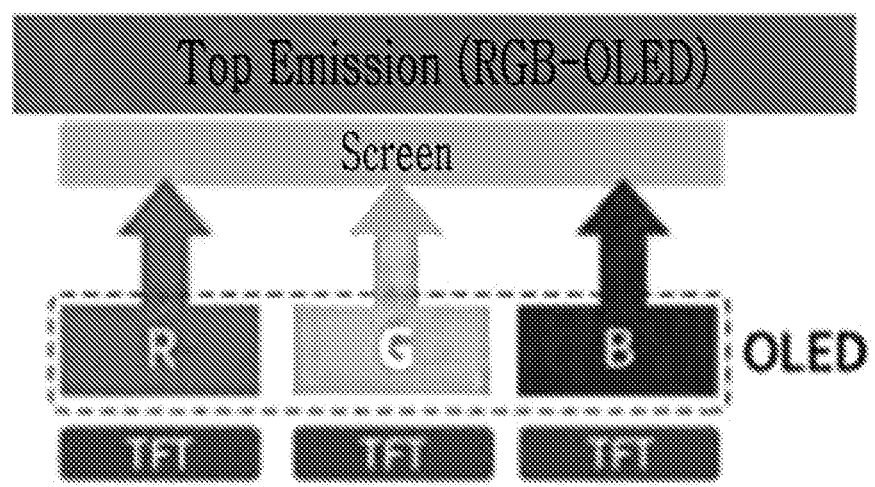
FIG. 4 is a view schematically illustrating a structure of a RGB-OLED.

FIGS. 3 and 4 show a structure of an organic light emitting diode (OLED)-type display device using no quantum dot. FIG. 3 is a structure known as "W-OLED," which corresponds to a structure covered with a color filter after all OLED devices emit white light. FIG. 4 is a structure known as "RGB-OLED," in which each of OLED devices emit light of red (R), green (G), and blue (B).

FIGS. 3 and 4 are a self-luminous structure which expresses true black but has disadvantages of inducing burn-in and high luminance, lack of frontal brightness, and having a complicated structure.

Figure 5:
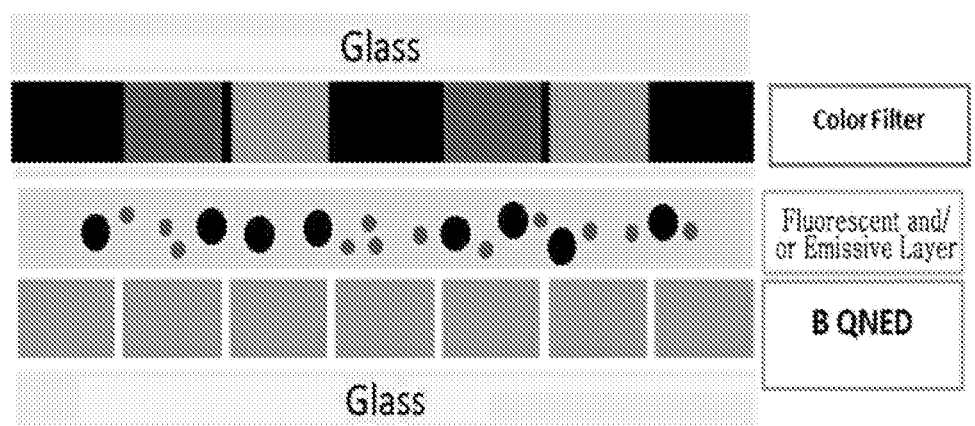
FIG. 5 is a view schematically illustrating a structure of a display device according to an embodiment.

A device according to an embodiment may have a structure of FIG. 5.

The structure of an embodiment, as far as a light source is concerned, may be a structure that a blue light emitting diode (blue LED) in the LCD structure of FIG. 1 is replaced with a blue quantum dot nanorod light emitting diode (B-QNED). In the LED of FIGS. 1 and 2, the quantum dot film may be light-receiving, and true black may be difficult to express. The blue quantum dot nanorod light emitting diode of the embodiment is self-luminous and thus may achieve 8K-level resolution and may also express true black.

In addition, the blue quantum dot nanorod light emitting diode may have high durability and thus may address the issues of burn-in and high luminance, which could occur in the OLED structure of FIGS. 3 and 4. The blue quantum dot nanorod light emitting diode may be capable of self-luminous driving in a pixel unit and thus may not require additional material such as a polarizer, a liquid crystal, or the like, but uses a fluorescent material such as Yag, KSF, or the like or a light emitting material such as QD or the like and thus generate white light, thereby increasing a degree of freedom about the materials.

In the display device according to an embodiment, a blue light source including the quantum dot nanorod light emitting diode may be used, and simultaneously, a wavelength converter converting the blue light emitted from the blue light source into white light may be on the blue light source. In the display device according to an embodiment, the white light expressed through a combination of the blue light source and the wavelength converter may pass through the color filter to express three primary colors of red (R), green (G), and blue (B).

In the display device according to an embodiment, the combination of the blue light source and the wavelength converter may contribute to improving characteristics of efficiency, durability, luminance, or the like, compared with a display device with a different structure.

The display device according to an embodiment may be referred to as 'White QNED or W-QNED' in terms of generating white light by the combination of the blue light source and the wavelength converter.

Hereinafter, the display device of the embodiment will be described in more detail.

Blue Light Source

As mentioned above, the blue light source may include the quantum dot nanorod light emitting diode that emits blue light in a wavelength range of about 400 nm to about 500 nm.

The quantum dot nanorod light emitting diode may not only be self-luminous and thus may express true black (e.g., when not illuminated) but may also be based on an inorganic material and thus may have no secondary reaction with an organic material and improved stability, and in addition, inkjet deposition may be applied thereto, having an effect of reducing a process cost.

In an implementation, the quantum dot nanorod light emitting diode may have a core-double shell structure including a nanorod-shaped core; a first shell surrounding the core; and a second shell surrounding the first shell. When the quantum dot nanorod light emitting diode has the core-double shell structure, it may have higher durability, thereby suppressing burn-in of the display device and lowering luminance.

In an implementation, the core may be a first conductivity type semiconductor layer; the first shell may be an active layer; and the second shell may be a second conductivity type semiconductor layer. In an implementation, each of the core and the second shell may include quantum dots emitting blue light in a wavelength range of about 400 nm to about 500 nm. In an implementation, the core may include an n-type quantum dot and the n-type quantum dot may include, e.g., n-GaN, n-GaP, n-GaAs, or a combination thereof. In an implementation, the second shell may include a p-type quantum dot, and the p-type quantum dot may include, e.g., p-GaN, p-GaSi, p-GaGe, or a combination thereof.

A length of a long axis (e.g., a maximum length or long axis length) of the nanorod light emitting diode may be about 50 nm to about 100 nm. In an implementation, the nanorod light emitting diode may have a long axis of, e.g., greater than or equal to about 50 nm, greater than or equal to about 55 nm, greater than or equal to about 60 nm, greater than or equal to about 65 nm, or greater than or equal to about 70 nm, and less than or equal to about 100 nm, less than or equal to about 95 nm, less than or equal to about 90 nm, less than or equal to about 85 nm, or less than or equal to about 80 nm.

In an implementation, an aspect ratio of the nanorod light emitting diode may be about 1:2 to about 2:1 as an aspect ratio of a width:length. In an implementation, the aspect ratio of the nanorod light emitting diode may be, e.g., greater than or equal to about 0.5, greater than or equal to about 0.75, greater than or equal to about 1.0, greater than or equal to about 2.0, or greater than or equal to about 1.0 and less than or equal to about 2.0, less than or equal to about 1.75, less than or equal to about 1.5, less than or equal to about 1.25, or less than or equal to about 1.0, as the aspect ratio of width/length.

When the long axis length and the aspect ratio of the nanorod light emitting diode satisfy the above ranges, it may have higher durability, and burn-in of the display device may be suppressed and luminance may be lowered.

The blue light source may have a thickness of about 1 μm to about 11 μm (e.g., in a direction perpendicular to a surface of the first substrate, described below). In an implementation, the blue light source may have a size or thickness of, e.g., greater than or equal to about 1 μm, greater than or equal to about 1.5 μm, greater than or equal to about 2.0 μm, or greater than or equal to about 2.5 μm, and less than or equal to about 11 μm, less than or equal to about 10.7 μm, less than or equal to about 10.0 μm, less than or equal to about 8.0 μm, less than or equal to about 6.0 μm, or less than or equal to about 5.0 μm. Within these ranges, the thickness may be selected.

Wavelength Converter

The wavelength converter may convert blue light (about 400 nm to about 500 nm) emitted from the blue light source to white light.

In an implementation, the wavelength converter may include a light emitting material including green quantum dots, red quantum dots, or a combination thereof; or may include a fluorescent material including YAG:Ce$^{3+}$, KSF, or a combination thereof.

The fluorescent material may emit yellow light in a wavelength range of about 580 nm to about 600 nm after absorbing blue light (about 400 nm to about 500 nm) emitted from the blue light source, and the light emitting material may itself emit yellow light in the wavelength range of about 580 nm to about 600 nm. In an implementation, the wavelength converter may emit yellow, which is a complementary color of blue, to convert blue light (about 400 nm to about 500 nm) from the blue light source to white light.

The wavelength converter may have a thickness of, e.g., about 1 μm to about 11 μm. In an implementation, the wavelength converter may have a thickness of, e.g., greater than or equal to about 1 μm, greater than or equal to about 1.5 μm, greater than or equal to about 2.0 μm, or greater than or equal to about 2.5 μm, and less than or equal to about 11 μm, less than or equal to about 10.7 μm, less than or equal to about 10.0 μm, less than or equal to about 8.0 μm, less than or equal to about 6.0 μm, or less than or equal to about 5.0 μm. Within these ranges, the thickness may be selected.

Color Filter Layer

The color filter layer may include, e.g., a first color filter, a second color filter, and a third color filter, e.g., configured to emit or transmit a different first light, second light, and third light.

In an implementation, the first light may be a red light, the second light may be a green light, and the third light may be a blue light.

In an implementation, the first color filter from which the first light (red light) is emitted may include a combination of R254, R177, and Y139; or a combination of red (Jansen series) and yellow (azo series) dyes. In an implementation, the second color filter from which the second light (green light) is emitted may include a green dye of G7, G59, G58, or G36 or a yellow colorant thereof (Y138, 150, 139, and the like). In an implementation, the third color filter from which the third light (blue light) is emitted may include a combination of B15:6, V23, or DPM dye and a TPM Jansen dye.

The color filter layer may have a thickness of, e.g., about 1 μm to about 11 μm. In an implementation, the color filter layer may have a thickness of, e.g., greater than or equal to about 1 μm, greater than or equal to about 1.5 μm, greater than or equal to about 2.0 μm, or greater than or equal to about 2.5 μm, and less than or equal to about 11 μm, less than or equal to about 10.7 μm, less than or equal to about 10.0 μm, less than or equal to about 8.0 μm, less than or equal to about 6.0 μm, or less than or equal to about 5.0 μm.

The first substrate may include glass.

The first substrate may have a thickness of, e.g., about 1 μm to about 11 μm. In an implementation, the first substrate may have a thickness of, e.g., greater than or equal to about 1 μm, greater than or equal to about 1.5 μm, greater than or equal to about 2.0 μm, or greater than or equal to about 2.5 μm, and less than or equal to about 11 μm, less than or equal to about 10.7 μm, less than or equal to about 10.0 μm, less than or equal to about 8.0 μm, less than or equal to about 6.0 μm, or less than or equal to about 5.0 μm.

In an implementation, a second substrate may be further included on the color filter layer.

In an implementation, the second substrate may have a thickness of, e.g., about 1 μm to about 11 μm. In an implementation, the second substrate may have a thickness of greater than or equal to about 1 μm, greater than or equal to about 1.5 μm, greater than or equal to about 2.0 μm, or greater than or equal to about 2.5 μm, and less than or equal to about 11 μm, less than or equal to about 10.7 μm, less than or equal to about 10.0 μm, less than or equal to about 8.0 μm, less than or equal to about 6.0 μm, or less than or equal to about 5.0 μm.

The second substrate may include glass.

By way of summation and review, next generation quantum dot display devices are being developed with a view toward increasing intensity of the light sources to help improve luminous efficiency of quantum dots or with a view toward developing new types of light sources in which a blue region is extended.

In quantum dot display devices, the luminous efficiency of quantum dots may be very closely affected by spectra of the light sources reaching the quantum dot materials, and currently, the light sources may have different characteristics depending on types, and improving the luminous efficiency of quantum dots for each light source may be considered.

One or more embodiments may provide a display device that includes a blue light source including a quantum dot nanorod light emitting diode and at the same time includes a wavelength converter configured to convert blue light emitted from the blue light source into white light, on the blue light source, so as to improve characteristics, such as efficiency, durability, and luminance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a first substrate;
a blue light source on the first substrate;
a wavelength converter on the blue light source; and
a color filter layer on the wavelength converter,
wherein:
the blue light source includes a quantum dot nanorod light emitting diode configured to emit a blue light in a wavelength range of about 400 nm to about 500 nm, the wavelength converter includes a light emitting material or a fluorescent material, the wavelength converter being configured to convert the blue light emitted from the blue light source into white light, the quantum dot nanorod light emitting diode has a core-double shell structure including a nanorod-shaped core, a first shell surrounding the core, and a second shell surrounding the first shell, the color filter layer includes:
   a first color filter configured to emit a first light,
   a second color filter configured to emit a second light, and
   a third color filter configured to emit a third light, and
the first light, the second light, and the third light are different from one another.

2. The display device as claimed in claim 1, wherein:
the core is a first conductivity type semiconductor layer;
the first shell is an active layer; and
the second shell is a second conductivity type semiconductor layer.

3. The display device as claimed in claim 1, wherein:
the core includes an n-type quantum dot, and
the n-type quantum dot includes n-GaN, n-GaP, n-GaAs, or a combination thereof.

4. The display device as claimed in claim 1, wherein:
the second shell includes a p-type quantum dot, and
the p-type quantum dot includes p-GaN, p-GaSi, p-GaGe, or a combination thereof.

5. The display device as claimed in claim 1, wherein the quantum dot nanorod light emitting diode has a long axis length of about 50 nm to about 100 nm.

6. The display device as claimed in claim 1, wherein the quantum dot nanorod light emitting diode has an aspect ratio of about 1:2 to about 2:1.

7. The display device as claimed in claim 1, wherein the blue light source has a thickness of about 1 μm to about 11 μm.

8. The display device as claimed in claim 1, wherein the wavelength converter includes:
   a light emitting material including green quantum dots, red quantum dots, or a combination thereof; or
   a fluorescent material including YAG:Ce$^{3+}$, KSF, or a combination thereof.

9. The display device as claimed in claim 1, wherein the wavelength converter has a thickness of about 1 μm to about 11 μm.

10. The display device as claimed in claim 1, wherein the first light is red light, the second light is green light, and the third light is blue light.

11. The display device as claimed in claim 1, wherein the color filter layer has a thickness of about 1 μm to about 11 μm.

12. The display device as claimed in claim 1, wherein the first substrate includes glass.

13. The display device as claimed in claim 1, wherein the first substrate has a thickness of about 1 μm to about 11 μm.

14. The display device as claimed in claim 1, further comprising a second substrate on the color filter layer.

15. The display device as claimed in claim 14, wherein the second substrate includes glass.

16. The display device as claimed in claim 15, wherein the second substrate has a thickness of about 1 μm to about 10 μm.

* * * * *